United States Patent
Ahn

(10) Patent No.: US 12,180,382 B2
(45) Date of Patent: *Dec. 31, 2024

(54) WINDOW COVER FILM AND FLEXIBLE DISPLAY PANEL INCLUDING THE SAME

(71) Applicants: SK Innovation Co., Ltd., Seoul (KR); SK IE Technology Co., Ltd., Seoul (KR)

(72) Inventor: Jong Nam Ahn, Daejeon (KR)

(73) Assignees: SK Innovation Co., Ltd., Seoul (KR); SK ie technology Co., Ltd., Seoul (KR)

( * ) Notice: Subject to any disclaimer, the term of this patent is extended or adjusted under 35 U.S.C. 154(b) by 343 days.

This patent is subject to a terminal disclaimer.

(21) Appl. No.: 17/229,095

(22) Filed: Apr. 13, 2021

(65) Prior Publication Data

US 2021/0317331 A1 Oct. 14, 2021

(30) Foreign Application Priority Data

Apr. 14, 2020 (KR) .................. 10-2020-0045167

(51) Int. Cl.
*C09D 133/08* (2006.01)
*C08G 73/14* (2006.01)
*C09D 183/04* (2006.01)
*H05K 5/03* (2006.01)

(52) U.S. Cl.
CPC ........... *C09D 133/08* (2013.01); *C08G 73/14* (2013.01); *C09D 183/04* (2013.01); *H05K 5/03* (2013.01)

(58) Field of Classification Search
CPC .... C09D 133/08; C09D 183/04; C08G 73/14; C08G 73/1042; C08G 73/1075; H05K 5/03; C08F 283/122; G09F 9/301; G09F 290/068; C08J 7/046; B32B 7/022; B32B 27/287; B32B 27/283; B32B 27/34; G02B 1/14

See application file for complete search history.

(56) References Cited

U.S. PATENT DOCUMENTS

| | | | |
|---|---|---|---|
| 9,706,649 B2 | 7/2017 | Jung et al. | |
| 10,815,378 B2 | 10/2020 | Kim et al. | |
| 2016/0185926 A1 | 6/2016 | Song et al. | |
| 2017/0101540 A1 | 4/2017 | Tiang et al. | |
| 2017/0156227 A1 | 6/2017 | Heo et al. | |
| 2017/0342224 A1 | 11/2017 | Chae et al. | |
| 2018/0346751 A1 | 12/2018 | Kim et al. | |
| 2019/0033494 A1 | 1/2019 | Kim et al. | |
| 2019/0077960 A1 * | 3/2019 | Kim | C08G 73/1039 |
| 2020/0061967 A1 * | 2/2020 | Cho | B32B 7/12 |
| 2020/0216614 A1 * | 7/2020 | Auman | C08G 73/1039 |
| 2020/0339769 A1 | 10/2020 | Lee et al. | |

FOREIGN PATENT DOCUMENTS

| | | | | |
|---|---|---|---|---|
| CN | 101701129 A | 5/2010 | | |
| CN | 103275583 A | 9/2013 | | |
| CN | 109486188 A | 3/2019 | | |
| JP | H04299139 A | 10/1992 | | |
| JP | 2001188102 A | 7/2001 | | |
| JP | 2015203807 A | * 11/2015 | ........... G09G 3/3611 | |
| JP | 2015229303 A | 12/2015 | | |
| JP | 2018118438 A | 8/2018 | | |
| JP | 201959210 A | 4/2019 | | |
| JP | 2019513887 A | 5/2019 | | |
| KR | 1020130074167 A | 7/2013 | | |
| KR | 1020160114339 A | 10/2016 | | |
| KR | 1020170028084 A | 3/2017 | | |
| KR | 1020170064103 A | 6/2017 | | |
| KR | 101927271 B1 | 12/2018 | | |
| KR | 1020190012847 A | 2/2019 | | |
| KR | 1020190029110 A | 3/2019 | | |
| KR | 20190071115 A | 6/2019 | | |
| KR | 1020200016797 A | 2/2020 | | |
| KR | 102147367 B1 | 8/2020 | | |
| TW | 201920369 A | 6/2019 | | |
| WO | 2019060169 A1 | 3/2019 | | |

OTHER PUBLICATIONS

Translation to English for JP 2015-203807 A via espacenet. accessed Nov. 21, 2022 (Year: 2015).*

* cited by examiner

*Primary Examiner* — Nancy R Johnson
(74) *Attorney, Agent, or Firm* — The Webb Law Firm

(57) ABSTRACT

Provided is a window cover film and a flexible display panel including the same. More particularly, a window cover film including a substrate layer and a hard coating layer and a flexible display panel including the same are provided.

9 Claims, No Drawings

WINDOW COVER FILM AND FLEXIBLE DISPLAY PANEL INCLUDING THE SAME

CROSS-REFERENCE TO RELATED APPLICATION

This application claims priority to Korean Patent Application No. 10-2020-0045167 filed Apr. 14, 2020, the disclosure of which is hereby incorporated by reference in its entirety.

BACKGROUND OF THE INVENTION

Field of the Invention

The following disclosure relates to a window cover film and a flexible display panel including the same.

Description of Related Art

A thin display is implemented in the form of a touch screen panel and is used in various smart devices including various wearable devices as well as smart phones and tablet PCs.

The touch screen panel-based displays are provided with a window cover made of tempered glass on a display panel for protecting the display panel from scratches or external shock.

However, in recent years, since the tempered glass is not suitable for weight lightening and is vulnerable to external shock, a technology for an optical plastic film having strength or scratch resistance corresponding to that of the tempered glass as well as flexibility and impact resistance has been developed.

As the plastic material, polyethylene terephthalate (PET), polyethersulfone (PES), polyethylene naphthalate (PEN), polyacrylate (PAR), polycarbonate (PC), polyimide (PI), polyaramide (PA), and the like are used, but since these materials have inferior hardness, lack scratch resistance, and have lower impact resistance as compared with the tempered glass, various attempts to form a hard coating layer on a plastic film have been made for solving the problem.

However, in the case of the conventional hard coating, since it is difficult to implement high hardness corresponding to that of the tempered glass, a curling phenomenon due to shrinkage during curing occurs greatly, and the flexibility is not sufficient, the conventional hard coating is not suitable as a protective window substrate for being applied to a flexible display, and in particular, a hard coating which may feel like glass to the touch and requires slip properties has yet to be developed.

RELATED ART DOCUMENTS

Patent Documents

Korean Patent Laid-Open Publication No. 10-2013-0074167 (Jul. 4, 2013)

SUMMARY OF THE INVENTION

An embodiment of the present invention is directed to providing a window cover film which feels like glass to the touch and has excellent slip properties in addition to scratch resistance and impact compensation.

Another embodiment of the present invention is directed to providing a window cover film which has excellent mechanical properties so that no crack occurs even with repetitive pending, and has excellent wear resistance, antifouling properties, and curl suppression properties.

In one general aspect, a window cover film is provided, in which a substrate layer including a polyamideimide-based resin and a hard coating layer formed on at least one surface of the substrate layer are laminated, wherein a kinetic friction coefficient is less than 0.15, the kinetic friction coefficient being measured at a speed of 100 mm/min with a force of 5 N under a load of 200 g using parchment paper as an object to be frictionized on the hard coating layer, and a ratio of a static friction coefficient a to the kinetic friction coefficient b satisfies the following Equation 1:

$0.5 \leq a/b \leq 1.5.$  [Equation 1]

More preferably, a window cover film having a/b of 1 to 1.3 is provided.

In an exemplary embodiment, the static friction coefficient may be 0.2 or less and the kinetic friction coefficient may be 0.1 or less.

In an exemplary embodiment, the substrate layer may have a modulus in accordance with ASTM D882 of 3 GPa or more, an elongation at break of 8% or more, a light transmittance of 5% or more as measured at 388 nm in accordance with ASTM D1746, a total light transmittance of 87% or more as measured at 400 to 700 nm, a haze of 2.0% or less, a yellow index of 5.0 or less, and a b* value of 2.0 or less.

In an exemplary embodiment, the substrate layer may be made up of a polyamideimide (PAI)-based resin including a fluorine atom and an aliphatic cyclic structure.

In an exemplary embodiment, the substrate layer may be made up of the polyamideimide (PAI)-based resin including a fluorine-based aromatic diamine-derived unit, an aromatic dianhydride-derived unit, a cycloaliphatic dianhydride-derived unit, and an aromatic diacid dichloride-derived unit.

In an exemplary embodiment, the substrate layer may have a thickness of 10 to 500 μm and the hard coating layer may have a thickness of 1 to 50 μm.

In an exemplary embodiment, the hard coating layer may have a pencil hardness of 4H or more and a water contact angle of 80° or more.

In an exemplary embodiment, the hard coating layer may be formed of a composition for forming a hard coating layer including a (meth)acryl-based siloxane resin and a polyfunctional (meth)acrylate-based compound.

In an exemplary embodiment, the window cover film may have a curl amount of 5 mm or less, the curl amount being measured at each vertex of a square sample having a side length of 10 cm each which has been cut to be inclined at an angle of 45° to an MD direction of a film.

In an exemplary embodiment, the window cover film may have no crack occurrence at 30,000 to 200,000 times in evaluation of dynamic bending properties.

In another general aspect, a flexible display panel includes the window cover film of the exemplary embodiment.

Other features and aspects will be apparent from the following detailed description, the drawings, and the claims.

DESCRIPTION OF THE INVENTION

Hereinafter, the present invention will be described in more detail. However, the following exemplary embodiment is only a reference for describing the present invention in detail, and the present invention is not limited thereto and may be implemented in various forms.

In addition, unless otherwise defined, all technical terms and scientific terms have the same meanings as those commonly understood by a person skilled in the art to which the present invention pertains. The terms used herein are only for effectively describing a certain specific example, and are not intended to limit the present invention.

In addition, the singular form used in the specification and claims appended thereto may be intended to also include a plural form, unless otherwise indicated in the context.

In addition, unless particularly described to the contrary, "comprising" any elements will be understood to imply further inclusion of other elements rather than the exclusion of any other elements.

In the present invention, a "film" is obtained by applying and drying a "polyamideimide-based resin solution" on a substrate and carrying out peeling off, and may be stretched or unstretched.

In the present invention, "curl" and "curling" may refer to bending-deformation of a film, a "curl amount" may refer to a vertical height from a lowest point of the film to a point where the film is bent and rises, when a curled film is placed on a plane.

The term "anti-curling property" used in the present specification may refer to a characteristic exhibiting less of the "curl amount".

In the present invention, "dynamic bending properties" may mean that even when a window cover film is repeatedly deformed (for example, folded and unfolded), permanent deformation and/or damage does/do not occur in a deformed part (for example, a folded part).

Hereinafter, the present invention will be described.

The inventors of the present invention conducted many studies, and as a result, found that a window cover film which has fingerprint resistance, feels like glass to the touch, and has excellent slip properties may be provided in a range where a ratio of a static friction coefficient to a kinetic friction coefficient satisfies a specific range, thereby completing the present invention.

Specifically, the inventors found that a window cover film which feels like glass to the touch and has excellent slip properties may be provided in a range where a kinetic friction coefficient (b) is less than 0.15, the kinetic friction coefficient (b) being measured at a speed of 100 mm/min with a force of 5 N under a load of 200 g using parchment paper as an object to be frictionized, and a ratio of a static friction coefficient (a) to the kinetic friction coefficient (b) satisfies 0.5≤a/b≤1.5, thereby completing the present invention.

In addition, the inventors found that a substrate layer made up of a polyamideimide-based resin and a hard coating layer on at least one surface of the substrate layer are formed to provide a window cover film which has significantly less occurrence of a curl amount due to a bond between the polyamideimide-based substrate layer and the hard coating layer, feels like glass to the touch, has excellent slip properties, has high surface hardness, is flexible, and has excellent bending properties, thereby completing the present invention.

In addition, in the present invention, a polyamideimide-based polymer having a fluorine-substituted polyamide block and an alicyclic structure may provide a film which feels better to the touch, has excellent flexibility and optical properties, has better bending properties, and has less of a curl amount, and thus, is more preferred.

The window cover film according to an exemplary embodiment of the present invention is a window cover film in which a substrate layer made up of a polyamideimide-based resin and a hard coating layer formed on at least one surface of the substrate layer are laminated, in which layers are laminated to be in direct contact with each other to achieve all of the physical properties to be desired, which is thus more preferred, and if necessary, another layer may be interposed between each layer or on the hard coating layer.

The window cover film according to an exemplary embodiment of the present invention has a characteristic of greatly improved mechanical physical properties and dynamic bending properties due to a chemical bond between the substrate layer and the hard coating layer.

In addition, the window cover film may feel like glass to the touch due to the chemical bond therebetween.

Specifically, the excellent or improved dynamic bending properties may mean that even when the window cover film is repeatedly deformed, specifically repeatedly folded and unfolded, deformation does not occur, and also, no crack occurs.

More specifically, the excellent or improved dynamic bending properties may mean that when the dynamic bending properties are measured, no crack occurs at 30,000 times or more, preferably 100,000 times or more, and more preferably 30,000 times to 200,000 times. The cracks may refer to fine cracks.

The term "fine crack" used in the present specification may refer to a crack having a size which is usually not observed by the naked eye. The fine crack may refer to, for example, a crack having a width of 0.5 μm or more and a length of 10 μm or more, and may be observed by a microscope.

Specifically, the present invention refers to a window cover film in which a substrate layer made up of a polyamideimide-based resin and a hard coating layer formed on at least one surface of the substrate layer are laminated.

The window cover film of the present invention may have a kinetic friction coefficient (b) of less than 0.15, the kinetic friction coefficient being measured at a speed of 100 mm/min with a force of 5 N under a load of 200 g using parchment paper on the hard coating layer, and a ratio of a static friction coefficient (a) to the kinetic friction coefficient (b) satisfying the following Equation 1.

Here, the kinetic friction coefficient and the static friction coefficient are measured in accordance with ASTM D1894 using friction test equipment (TOYOSEIKI, TR-2).

$$0.5 \leq a/b \leq 1.5 \quad \text{[Equation 1]}$$

The ratio (a/b) of the static friction coefficient (a) to the kinetic friction coefficient (b) may be preferably 0.6 to 1.4, more preferably 0.8 to 1.3, and still more preferably 0.9 to 1.2.

Within the range, durability and surface strength like glass may be provided, and users may feel like touching glass.

Hereinafter, each configuration of the present invention will be described in detail.

<Substrate Layer>

A substrate layer has excellent optical physical properties and mechanical physical properties, and may be made up of a material having elasticity and restoring force.

In an exemplary embodiment of the present invention, the substrate layer may have a thickness of 10 to 500 μm, 20 to 250 μm, or 30 to 100 μm.

In an exemplary embodiment of the present invention, the substrate layer may have a modulus in accordance with ASTM D882 of 3 GPa or more, 4 GPa or more, or 5 GPa or more, an elongation at break of 8% or more, 12% or more, or 15% or more, a light transmittance of 5% or more or 5 to 80% as measured at 388 nm in accordance with ASTM D1746, a total light transmittance of 87% or more, 88% or more, or 89% or more as measured at 400 to 700 nm, a haze according to ASTM D1003 of 2.0% or less, 1.5% or less, or 1.0% or less, a yellow index in accordance with ASTM E313 of 5.0 or less, 3.0 or less, or 0.4 to 3.0, and a value of 2.0 or less, 1.3 or less, or 0.4 to 1.3.

In an exemplary embodiment, the substrate layer is a polyamideimide resin.

In addition, more preferably, the substrate layer of the present invention may be a polyamideimide-based resin including a fluorine atom and an aliphatic cyclic structure, and thus, may have excellent mechanical physical properties and dynamic bending properties.

As a more specific example, the substrate layer may include a polyamideimide-based resin derived from a fluorine-based aromatic diamine, an aromatic dianhydride, a cycloaliphatic dianhydride, and an aromatic diacid dichloride.

In an exemplary embodiment of the present invention, as an example of the polyamideimide-based resin including a fluorine atom and an aliphatic cyclic structure, a polyamideimide polymer is prepared by preparing an amine-terminated polyamide oligomer from a first fluorine-based aromatic diamine and an aromatic diacid dichloride, and polymerizing the amine-terminated polyamide oligomer with a monomer derived from a second fluorine-based aromatic diamine, an aromatic dianhydride, and a cycloaliphatic dianhydride and performing imidization, and the polymer is preferred since it achieves the object of the present invention better, but the present invention is not limited thereto.

The first fluorine-based aromatic diamine and the second fluorine-based aromatic diamine may be the same as or different from each other.

In an exemplary embodiment of the present invention, it is more preferred that the amine-terminated oligomer having an amide structure formed in a polymer chain by the aromatic diacid dichloride is included as the monomer of the diamine, as described above, since not only optical physical properties but also mechanical strength particularly including the modulus may be improved, and also the dynamic bending properties may be further improved, but the present invention is not necessarily limited thereto.

In an exemplary embodiment of the present invention, when the fluorine-substituted polyamide oligomer block is included, a mole ratio between the diamine monomer including the amine-terminated fluorine-substituted polyoligomer and a second fluorine-based aromatic diamine and the dianhydride monomer including an aromatic dianhydride and a cycloaliphatic dianhydride of the present invention may be 1:0.9 to 1.1, preferably 1:1.

In addition, a content of the amine-terminated polyamide oligomer with respect to the total diamine monomer is not particularly limited, but is 30 mol % or more, preferably 50 mol % or more, and more preferably 70 mol % or more for satisfying the mechanical physical properties, the yellow index, and the optical properties of the present invention, and also, when the polyamideimide film having a surface energy difference of the present invention is provided, selectivity of a coating solvent may be increased by diversity of solubility.

In addition, a composition ratio of the aromatic dianhydride and the cycloaliphatic dianhydride is not particularly limited, but a ratio of 30 to 80 mol %:70 to 20 mol % is preferred considering the transparency, the yellowness, and the mechanical physical properties of the present invention, but the present invention is not necessarily limited thereto.

In addition, in the present invention, another example of the polyamideimide-based resin including a fluorine atom and an aliphatic cyclic structure may be a polyamideimide-based resin obtained by mixing, polymerizing, and imidizing the fluorine-based aromatic diamine, the aromatic dianhydride, the cycloaliphatic dianhydride, and the aromatic diacid dichloride.

The resin has a random copolymer structure, may include 40 mol or more, preferably 50 to 80 mol of the aromatic diacid dichloride, 10 to 50 mol of the aromatic dianhydride, and 10 to 60 mol of the cyclic aliphatic dianhydride with respect to 100 mol of the diamine, and may be prepared by performing polymerization at a mole ratio of 1:0.9 to 1.1, preferably 1:1 of the sum of the diacid dichloride and the dianhydride to the diamine monomer.

The random polyamideimide of the present invention is somewhat different from the block-type polyamideimide resin in the optical properties such as transparency, the mechanical physical properties, and solvent sensitivity due to a surface energy difference, but may belong to the category of the present invention.

In an exemplary embodiment of the present invention, as the fluorine-based aromatic diamine component, a mixture of 2,2'-bis(trifluoromethyl)-benzidine and another known aromatic diamine component may be used, or 2,2'-bis(trifluoromethyl)-benzidine may be used alone. By using the fluorine-based aromatic diamine as such, the optical properties of the polyamideimide-based film may be improved, and the yellowness may be improved. In addition, the tensile modulus of the polyamideimide-based film may be improved to improve the mechanical strength of the window cover film and to further improve the dynamic bending properties of the window cover film.

As the aromatic dianhydride, at least one or two or more of 4,4'-hexafluoroisopropylidene diphthalic anhydride (6FDA), biphenyltetracarboxylic dianhydride (BPDA), 4,4'-oxydiphthalic dianhydride (ODPA), sulfonyl diphthalic anhydride (SO2DPA), (isopropylidenediphenoxy) bis(phthalic anhydride) (6HDBA), 4-(2,5-dioxotetrahydrofuran-3-yl)-1,2,3,4-tetrahydronaphthalene-1,2-dicarboxylic dianhydride (TDA), 1,2,4,5-benzene tetracarboxylic dianhydride (PMDA), benzophenone tetracarboxylic dianhydride (BTDA), bis(3,4-carboxyphenyl) dimethylsilane dianhydride (SiDA), and bis(dicarboxyphenoxy) diphenyl sulfide dianhydride (BDSDA) may be used, but the present invention is not limited thereto.

As an example of the cycloaliphatic dianhydride, any one or a mixture of two or more selected from the group consisting of 1,2,3,4-cyclobutanetetracarboxylic dianhydride (CBDA), 5-(2,5-dioxotetrahydrofuryl)-3-methylcyclohexene-1,2-dicarboxylic dianhydride (DOCDA), bicyclo[2.2.2]oct-7-en-2,3,5,6-tetracarboxylic dianhydride (BTA), bicyclooxtene-2,3,5,6-tetracarboxylic dianhydride (BODA), 1,2,3,4-cyclopentanetetracarboxylic dianhydride (CPDA), 1,2,4,5-cyclohexanetetracarboxylic dianhydride (CHDA), 1,2,4-tricarboxy-3-methylcarboxycyclopentane dianhydride (TMDA), 1,2,3,4-tetracarboxycyclopentane dianhydride (TCDA), and derivatives thereof may be used.

In an exemplary embodiment of the present invention, when the amide structure in the polymer chain is formed by the aromatic diacid dichloride, not only the optical physical properties but also the mechanical strength particularly including the modulus may be greatly improved, and also the dynamic bending properties may be further improved.

As the aromatic diacid dichloride, any one or a mixture of two or more selected from the group consisting of isophthaloyl dichloride (IPC), dicarbonyl dichloride (TPC), [1,1'- biphenyl]-4,4'-dicarbonyl dichloride (BPC), 1,4-naphthalene dicarboxylic dichloride (NPC), 2,6-naphthalene dicarboxylic dichloride (NTC), 1,5-naphthalene dicarboxylic dichloride (NEC), and derivatives thereof may be used, but the present invention is not limited thereto.

Hereinafter, a method of preparing a film as the substrate layer will be illustrated without limitation.

In an exemplary embodiment of the present invention, the substrate layer may be prepared by applying a "polyamideimide-based resin solution" including a polyamideimide-based resin and a solvent on a substrate, and performing drying or drying and stretching. That is, the substrate layer may be prepared by a solution casting method.

As an example, the substrate layer may be prepared by including the following steps: reacting a fluorine-based aromatic diamine and an aromatic diacid dichloride to prepare an oligomer, reacting the thus-prepared oligomer with the fluorine-based aromatic diamine, an aromatic dianhydride, and a cycloaliphatic dianhydride to prepare a polyamic acid solution, imidizing the polyamic acid solution to prepare a polyamideimide resin, and applying a polyamideimide solution in which the polyamideimide resin is dissolved in an organic solvent to form a film.

Hereinafter, each step will be described by taking a case in which a block polyamideimide film is prepared as an example.

The step of preparing an oligomer may include reacting the fluorine-based aromatic diamine and the aromatic diacid dichloride and purifying and drying the obtained oligomer.

In this case, the fluorine-based aromatic diamine may be introduced at a mole ratio of 1.01 to 2 with respect to the aromatic diacid dichloride to prepare an amine-terminated polyamide oligomer monomer. A molecular weight of the oligomer monomer is not particularly limited, but for example, when the weight average molecular weight is in a range of 1000 to 3000 g/mol, better physical properties may be obtained. Here, a side reaction may be suppressed by polymerizing the oligomer in the presence of pyridine to prepare a resin having better physical properties.

In addition, it is preferred to use an aromatic carbonyl halide monomer such as terephthaloyl chloride or isophthaloyl chloride, not terephthalic ester or terephthalic acid itself, for introducing an amide structure, and this is considered to influence the physical properties of the film by a chlorine element, though it is not clear.

Next, the step of preparing a polyamic acid may be performed by a solution polymerization reaction in which the thus-prepared oligomer is reacted with the fluorine-based aromatic diamine, the aromatic dianhydride, and the cycloaliphatic dianhydride in an organic solvent.

Here, the organic solvent used for the polymerization reaction may be, as an example, any one or two or more polar solvents selected from dimethylacetamide (DMAc), N-methyl-2-pyrrolidone (NMP), dimethylformamide (DMF), dimethylsulfoxide (DMSO), ethylcellosolve, methylcellosolve, acetone, ethyl acetate, m-cresol, and the like.

Next, the step of imidization may be performed by chemical imidization, and more preferably, by chemical imidization of a polyamic acid solution using pyridine and an acetic anhydride. The imidization may be performed using an imidization catalyst and a dehydrating agent at a low reaction temperature of 150° C. or lower, preferably 100° C. or lower, and specifically 50 to 150° C.

The chemical imidization is preferred, since uniform mechanical physical properties may be imparted to the entire film as compared with the case of an imidization reaction by heat at a high temperature.

As the imidization catalyst, any one or two or more selected from pyridine, isoquinoline and β-quinoline may be used. In addition, as the dehydrating agent, any one or two or more selected from an acetic anhydride, a phthalic anhydride, a maleic anhydride, and the like may be used, but the present invention is not necessarily limited thereto.

In addition, an additive such as a flame retardant, an adhesion improver, inorganic particles, an antioxidant, a UV inhibitor, and a plasticizer may be mixed with the polyamic acid solution to prepare the polyamideimide resin.

In the present invention, a weight average molecular weight of the polyamideimide resin is not particularly limited, but may be 200,000 g/mol or more, preferably 300,000 g/mol or more, and more preferably 300,000 to 400,000 g/mol. The range is preferred, since within the range, when the film is formed and then a hard coating layer is formed on the layer, curl occurrence is suppressed and better dynamic bending properties may be provided due to a chemical bond with the hard coating layer, but the present invention is not necessarily limited thereto.

In the present invention, film formation may be performed by preparing polyamideimide by the imidization step, performing purification, and dissolving the polyamideimide in a solvent such as N,N-dimethylacetamide (DMAc).

This step of the present invention may be performed by applying a polyamideimide solution on a substrate and then drying the solution in a drying step divided into a dry area or adding a stretching step after or before drying, or by adding a heat treatment step after the drying and/or stretching step. The substrate for casting a solution is not particularly limited, but for example, glass, stainless steel, another substrate film, or the like may be used, but the present invention is not limited thereto. Application of the polyamideimide of the present invention on the substrate layer may be performed by a die coater, an air knife, a reverse roll, spray, a blade, casting, gravure, spin coating, and the like, but usually a method of casting a solution may be used without limitation.

<Hard Coating Layer>

The hard coating layer according to the present exemplary embodiment is formed for protecting the substrate layer having excellent optical and mechanical properties from external physical and chemical damage.

In an exemplary embodiment of the present invention, the hard coating layer may have a thickness of 1 to 50% of the total thickness of the window cover film including the substrate film and the hard coating layer.

In the present invention, the hard coating layer may retain optical properties while having excellent hardness, and may have a thickness of 1 to 50 μm, more preferably 1 to 30 μm, a pencil hardness of 2H or more, 3H or more, or 4H or more, more preferably 4H to 9H, no occurrence of scratch at 10 times/1 Kgf, times/1 Kgf, or 30 times/1 Kgf in scratch evaluation using steel wool (#0000, Liberon), and a water contact angle of 80° or more, 90° or more, or 100° or more.

An example of a composition for providing the hard coating layer of the present invention which imparts the above characteristics includes a composition for forming a hard coating layer including a (meth)acryl-based siloxane resin and a polyfunctional (meth)acrylate-based compound, and the hard coating layer may be formed by applying the composition on the substrate layer forming the window cover film and performing curing.

In an exemplary embodiment of the present invention, the (meth)acryl-based siloxane resin refers to a siloxane resin having a (meth)acrylate group, and the (meth)acrylate may be an alicyclic (meth)acrylate group, an aliphatic (meth)

acrylate group, an aromatic (meth)acrylate group, or a mixture thereof, and preferably, may be silsesquioxane having (meth)acrylate (hereinafter, referred to as a (meth)acrylate siloxane resin).

The (meth)acrylate siloxane resin according to the present invention has a weight average molecular weight of 500 to 30,000, preferably 1,000 to 20,000 in terms of securing both high hardness and processability, and more preferably 5,000 to 15,000, and the (meth)acrylate siloxane resin having a polydispersity index (PDI) of 2.0 to 4.0 is preferred, since when the resin is used, both physical properties of hardness and softness of the coating layer may be satisfied and coating properties and surface smoothness are excellent, but the present invention is not necessarily limited thereto.

The composition for forming a hard coating layer of the present invention may provide a kinetic friction coefficient and a substrate layer satisfying Equation 1 due to a chemical bond with the polyamideimide-based substrate layer, impart the feeling of glass to the touch, and significantly improve hardness. Besides, the composition may significantly improve flexibility to suppress bending deformation and curl occurrence.

$$0.5 \leq a/b \leq 1.5 \quad \text{[Equation 1]}$$

(Ratio (a/b) of Static Friction Coefficient (a) to Kinetic Friction Coefficient (b))

The (meth)acrylate siloxane resin according to the present invention may be prepared by hydrolysis and a condensation reaction of alkoxysilane having a (meth)acrylate group alone or alkoxysilane having a (meth)acrylate group with another alkoxysilane of a different kind in the presence of water.

A catalyst used in the reaction is not particularly limited as long as it is commonly used in the art, but for example, may be selected from the group consisting of acid catalyst such as hydrochloric acid, acetic acid, hydrogen fluoride, nitric acid, sulfuric acid, chlorosulfonic acid, iodic acid, and pyrophosphoric acid; base catalysts such as ammonia, potassium hydroxide, sodium hydroxide, barium hydroxide, imidazole, n-butylamine, di-n-butylamine, tri-n-butylamine, ammonium perchlorate, and tetramethylammonium hydroxide; ion exchange resins such as Amberite IRA-400 and IRA-67; and combinations thereof.

An amount of the catalyst is not particularly limited, but the acid catalyst and the base catalyst may be added at 0.0001 to 0.01 parts by weight with respect to 100 parts by weight of alkoxysilane, and the ion exchange resin may be added at 1 to 10 parts by weight with respect to 100 parts by weight of alkoxysilane, but the present invention is not limited thereto.

The hydrolysis and the condensation reaction may be performed by stirring at room temperature for about 12 hours to about 7 days, and stirring may be performed at about 60° C. to about 100° C. for about 2 hours to about 72 hours for acceleration of the reaction, but the present invention may not be limited thereto.

In addition, alcohol and water are produced as a by-product of the reaction, and by removing them, a reverse reaction may be decreased and a forward reaction may be induced, thereby adjusting a reaction speed. In addition, when the reaction is finished, alcohol and water remaining in the siloxane resin may be removed by applying conditions of about 60° C. to about 100° C. for about 10 minutes to about 60 minutes under reduced pressure, but the present invention may not be limited thereto.

The alkoxysilane having a (meth)acrylate group used in the preparation of the (meth)acrylatesiloxane resin according to an exemplary embodiment of the present invention may be exemplified by the following Chemical Formula 1:

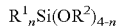   [Chemical Formula 1]

wherein $R^1$ is a (meth)acrylate tricycloalkyl group having 3 to 6 carbon atoms or a linear or branched alkyl group having 1 to 6 carbon atoms, substituted with an oxylanyl group, $R^2$ is a linear or branched alkyl group having 1 to 7 carbon atoms, and n is an integer of 1 to 3.

The alkoxysilane represented by Chemical Formula 1 is not particularly limited, and examples thereof may include 3-acryloxypropyltrimethoxysilane, 3-methacryloyloxypropyltrimethoxysilane, and the like. These may be used alone or in combination of two or more.

In an exemplary embodiment of the present application, the (meth)acrylate siloxane resin may be prepared by the alkoxysilane having (meth)acrylate alone, or by hydrolysis and a condensation reaction of the alkoxysilane having (meth)acrylate with another alkoxysilane of a different kind, but the present invention may not be limited thereto.

The alkoxysilane of a different kind may be one or more selected from alkoxysilane represented by the following Chemical Formula 2:

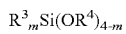   [Chemical Formula 2]

wherein $R^3$ is an alkyl group having 1 to 20 carbon atoms, a cycloalkyl group having 3 to 8 carbon atoms, an alkenyl group having 3 to 20 carbon atoms, an alkynyl group having 2 to 20 carbon atoms, or an aryl group having 6 to 20 carbon atoms and may include one or more functional groups selected from the group consisting of an acryl group, a methacryl group, a halogen group, an amino group, a mercapto group, an ether group, an ester group, a carbonyl group, a carboxyl group, a vinyl group, a nitro group, a sulfon group, and an alkyd group, $R^4$ is a linear or branched alkyl group having 1 to 7 carbon atoms, and m is an integer of 0 to 3.

The alkoxysilane represented by Chemical Formula 2 is not particularly limited, and for example, may be one or a mixture of two or more selected from N-(3-acryloxy-2-hydroxypropyl)-3-aminopropyltrimethoxysilane, N-(3-acryloxy-2-hydroxypropyl)-3-aminopropyltriethoxysilane, N-(3-acryloxy-2-hydroxypropyl)-3-aminopropyltripropoxysilane, 3-acryloxypropylmethylbis(trimethoxy)silane, 3-acryloxypropyltriethoxysilane, 3-acryloxypropyltripropoxysilane, 3-(meth)acryloxypropyltriethoxysilane, 3-(meth)acryloxypropyltripropoxysilane, and the like.

As an exemplary embodiment, the composition for forming a hard coating layer may include a (meth)acrylate-based compound. The (meth)acrylate-based compound may be a (meth)acrylate-based compound having one (meth)acrylate functional group, or a polyfunctional (meth)acrylate having two or more functional groups to derive a crosslinking reaction, and it is preferred to selectively add the (meth)acrylate-based compound, since hardness is excellent and feel like glass to the touch and slip properties may be further improved.

The (meth)acrylate-based compound of the present invention refers to a compound including a (meth)acrylate group, and (meth)acrylate refers to acrylate or methacrylate.

The (meth)acrylate-based compound of the present invention is not particularly limited, as long as it includes a (meth)acrylate group, and for example, it may include at least one of (meth)acrylate monomers and (meth)acrylate oligomers. In the present specification, the oligomer refers to having 2 to 20 repeated units.

The (meth)acrylate compound is not particularly limited within a range of not departing from the object of the present invention, and specific examples thereof include: 2-ethylhexyl acrylate, octadecylacrylate, isodecylacrylate, 2-phenoxyethyl acrylate, laurylacrylate, stearylacrylate, behenylacrylate, tridecylmethacrylate, nonylphenolethoxylate monoacrylate, β-carboxyethylacrylate, isobornylacrylate, tetrahydrofurfurylacrylate, tetrahydrofurfurylmethacrylate, 4-butylcyclohexyl acrylate, dicyclopentenylacrylate, dicyclopentenyloxyethylacrylate, ethoxyethoxyethylacrylate, ethoxylated monoacrylate, 1,6-hexanediol diacrylate, triphenylglycoldiacrylate, butanediol diacrylate, 1,3-butyleneglycol dimethacrylate, 1,6-hexanediol dimethacrylate, neopentylglycol diacrylate, ethyleneglycol dimethacrylate, diethyleneglycol diacrylate, diethyleneglycol dimethacrylate, tetraethyleneglycol, diacrylate, tetraethyleneglycol dimethacrylate, triethyleneglycol diacrylate, triethyleneglycol dimethacrylate, polyethyleneglycol diacrylate, polyethyleneglycol dimethacrylate, dipropyleneglycol diacrylate, ethoxylated neopentylglycol diacrylate, trimethyloylpropane triacrylate, trimethylolpropane trimethacrylate, pentaerythritol triacrylate, pentaerythritol trimethacrylate, pentaerythritol tetramethacrylate, pentaerythritol tetraacrylate, dipentaerythritol pentaacrylate, dipentaerythritol hexaacrylate, dipentaerythritol pentamethacrylate, dipentaerythritol hexamethacrylate, phosphagenacrylate, phosphagenmethacrylate, ethoxylated triacrylate, tris(2-hydroxyethyl)isocyanurate triacrylate, dipentaerythritol pentaacrylate, ditrimethylolpropane tetraacrylate, alkoxylated tetraacrylate, and the like, and preferably may include: pentaerythritol triacrylate, pentaerythritol trimethacrylate, pentaerythritol tetramethacrylate, pentaerythritol tetraacrylate, dipentaerythritol pentaacrylate, dipentaerythritol hexaacrylate, dipentaerythritol pentamethacrylate, dipentaerythritol hexamethacrylate, phosphagenacrylate, phosphagenmethacrylate, and the like. These may be used alone or in combination of two or more.

The (meth)acrylate oligomer is not particularly limited within a range of not departing the object of the present invention, and specific examples thereof include polyester (meth)acrylate, urethane (meth)acrylate, epoxy(meth)acrylate, polyether (meth)acrylate, and the like. These may be used alone or in combination of two or more.

Since it is preferred that the (meth)acrylate-based compound includes 6 to 15 (meth)acrylate groups in the molecule for improving hardness and bending properties, an oligomer may be used in this respect, and more preferably, urethane (meth)acrylate may be used.

The composition for forming a hard coating layer of the present invention may further include common thermal initiators or photoinitiators.

The photoinitiator may be used without limitation as long as it may initiate photopolymerization of the (meth)acrylatesiloxane resin and the (meth)acrylate-based compound, and examples thereof include: benzoin, benzoin methyl ether, benzoinethyl ether, benzoin isopropyl ether, benzoin-n-butyl ether, benzoinisobutylether, acetophenone, hydroxydimethylacetophenone, dimethylaminoacetophenone, dimethoxy-2-phenylacetophenone, 3-methylacetophenone, 2,2-dimethoxy-2-phenylacetophenone, 2,2-diethoxy-2-phenylacetophenone, 4-cronol acetophenone, 4,4-dimethoxyacetophenone, 2-hydroxy-2-methyl-1-phenylpropan-1-one, 4-hydroxycyclophenylketone, 1-hydroxycyclohexylphenylketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4-diaminobenzophenone, 4,4'-diethylaminobenzophenone, dichlorobenzophenone, anthraquinone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxhanthone, 2,4-diethylthioxanthone, benzyldimethylketal, diphenylkektonebenzyldimethylketal, acetophenonedimethylketal, p-dimethylaminobenzoic acid ester, 2,4,6-trimethylbenzoyl-diphenyl-phosphine oxide, fluorene, triphenylamine, carbazol, and the like. These may be used alone or in combination of two or more.

A content of the photoinitiator is not particularly limited, and for example, may be 0.1 to 20 wt %, based on the total weight of the composition for forming a hard coating layer.

The composition for forming a hard coating layer of the present invention may further include a solvent.

The solvent according to the present invention is not particularly limited and may be a solvent known in the art, and examples thereof may include alcohol-based solvents (such as methanol, ethanol, isopropanol, butanol, methyl cellosolve, and ethyl cellosolve), ketone-based solvents (such as methyl ethyl ketone, methyl butyl ketone, methyl isobutyl ketone, diethyl ketone, dipropyl ketone, and cyclohexanone), hexane-based solvents (such as hexane, heptane, and octane), benzene-based solvents (such as benzene, toluene, and xylene), and the like. These may be used alone or in combination of two or more.

A content of the solvent according to the present invention is not particularly limited, and for example, may be 10 to 60 wt %, based on the total weight of the composition for forming a hard coating layer. When the content of the solvent is within the range, appropriate viscosity is maintained to have excellent workability, it is easy to adjust a thickness of a coating film, and a process speed may be improved.

If necessary, the composition for forming a hard coating layer of the present invention may further include a lubricant for improving winding efficiency, blocking resistance, wear resistance, and scratch resistance.

The kind of lubricants is not particularly limited, and for example, may be waxes such as polyethylene wax, paraffin wax, synthetic wax, or montan wax; synthetic resins such as a silicone-based resin or a fluorine-based resin; and the like. These may be used alone or in combination of two or more. A content of the lubricant is not particularly limited, and for example, may be 0.1 to 5 wt %, based on the total weight of the composition for forming a hard coating layer. Within the range of the content, excellent transparency may be maintained while blocking resistance, friction resistance, and scratch resistance are imparted.

In addition, if necessary, additives such as an antioxidant, a UV absorber, a photostabilizer, a thermal polymerization inhibitor, a leveling agent, a surfactant, a lubricating agent, and an antifouling agent may be further included.

Hereinafter, a method of forming the hard coating layer will be described in detail.

In an exemplary embodiment of the present invention, the hard coating layer may be formed by applying and curing the composition for forming a hard coating layer described above on an upper surface or a lower surface of the substrate layer. The curing may be performed by thermal curing and/or photocuring, and a method known in the art may be used.

Application may be performed by a known method such as a die coater, an air knife, a reverse roll, spraying, a blade, casting, gravure, and spin coating.

A curing method is not particularly limited, and for example, photocuring or thermal curing may be performed alone or a method of performing thermal curing after photocuring or photocuring after thermal curing may be carried out.

In an exemplary embodiment of the present invention, by using the composition for forming a hard coating layer, the substrate layer may be physically protected, the mechanical physical properties may be further improved, the dynamic bending property may be further improved, and curl occurrence may be significantly decreased.

Specifically, a window cover film having no crack occurrence even at 30,000 times or more, more specifically 30,000 times to 200,000 times, and more preferably 200,000 times or more in the dynamic bending property evaluation, may be provided. In addition, a window cover film having a curl amount of 5 mm or less, preferably 4 mm or less, more preferably 3 mm or less, and more preferably 0 to 2 mm when measured by an evaluation method described later, may be provided.

In an exemplary embodiment of the present invention, a plurality of substrate layers and a plurality of hard coating layers may be laminated.

For example, a plurality of substrate layers and a plurality of hard coating layers may be alternately laminated. In addition, the hard coating layer may be placed on each of one surface or both surfaces of the substrate layer.

In an exemplary embodiment of the present invention, as the substrate made up of a polyamideimide-based resin and a hard coating layer formed on at least one surface of the substrate layer are laminated, uniform physical properties are expressed by a chemical bond between the substrate layer and the hard coating layer, thereby expressing uniform physical properties over the total area of the film, and imparting durability and glass-like texture.

More specifically, a kinetic friction coefficient may be less than 0.15 or 0.1, the kinetic fraction coefficient being measured at a speed of 100 mm/min with a force of 5 N under a load of 200 g using parchment paper as an object to be frictionized on the hard coating layer, and a ratio of a static friction coefficient a to the kinetic friction coefficient b may satisfy the following Equation 1:

$$0.5 \leq a/b \leq 1.5.$$ [Equation 1]

More specifically, the ratio a/b of the static friction coefficient a to the kinetic friction coefficient b may be 0.6 to 1.4, more preferably 0.8 to 1.3, and more preferably 0.9 to 1.2.

Within the range, durability and surface strength like glass may be provided, and users may feel like they are touching glass.

The window cover film may have the static friction coefficient of 0.2 or less, 0.15 or less, 0.12 or less, or 0.01 to 0.12. In addition, the kinetic friction coefficient may be 0.15 or less, 0.11 or less, or 0.01 to 0.1. Within the range, the slip properties are excellent and glass-like texture may be may be expressed, which is thus more preferred.

In addition, the window cover film may provide a window cover film which feels like glass to the touch as described above, has excellent durability, and has a curl suppression characteristic. The "curl suppression characteristic" may mean that a curl amount is significantly small.

The curl amount may refer to a vertical height from the lowest position (for example, a center) to the vertex of a film for each vertex of a sample, the sample being a window cover film cut into a square which is inclined at an angle of 45° to the MD direction and has each side of 10 cm in length.

Since the curl amount is measured for the sample inclined at the angle of 45° to the MD direction, the curls at each vertex refer to curl amounts in the MD direction and in a direction perpendicular to the MD direction to distinguish the curl amounts in each direction.

In some exemplary embodiment, the window cover film may have the curl amount of 5 mm or less, preferably 4 mm or less, more preferably 3 mm or less, and very preferably 0 to 2 mm.

<Flexible Display Panel>

In an exemplary embodiment of the present invention, a flexible display panel or a flexible display device including the window cover film according to the exemplary embodiment may be provided.

Here, the window cover film may be used as an outermost surface window substrate of the flexible display device. The flexible display device may be various image displays such as a common liquid crystal display, an electroluminescent display, a plasma display, and a field emission display.

Hereinafter, the present invention will be described in more detail with reference to the Examples and Comparative Examples. However, the following Examples and Comparative Examples are only an example for describing the present invention in detail, and do not limit the present invention in any way.

1) Friction Coefficient

A film was cut into 50 mm wide and 150 mm long in accordance with ASTM D1894 and fixed to a fraction tester (TOYOSEIKI, TR-2), parchment paper was used as an object to be frictionized, and a distance of 100 mm at a speed of 100 mm/min was measured under a load of 200 g and a load of 5 N.

2) Touch

When 30 panels rubbed the surface of the manufactured window cover film, a degree of touch was evaluated with the case in which the surface felt like real glass to the touch being 10 points, and the total scores of the 30 panels were averaged.

3) Weight Average Molecular Weight

<Weight Average Molecular Weight of Film>

Measurement was performed by dissolving a film in a DMAc eluent containing 0.05 M LiBr. For GPC, Waters GPC system, Waters 1515 isocratic HPLC Pump, and Waters 2414 Refractive Index detector were used, for a column, Olexis, Polypore, and a mixed D column were connected and polymethylmethacrylate (PMMA STD) was used as a standard material, and analysis was performed at 35° C. at a flow rate of 1 mL/min.

<Weight Average Molecular Weight of Acryl Siloxane Resin>

The weight average molecular weight of an acryl siloxane resin was measured by using GPC (Waters GPC system, Waters 1515 isocratic HPLC Pump, Waters 2414 Reflective Index detector), connecting 4 columns of Shodex KF-801, 802.5, 803, and 805 available from Waters in series as a GPC column, and using THF as a solvent at a speed of 1 mL/min.

4) Modulus/Elongation at Break

According to ASTM D882, the elongation at break was measured using UTM 3365 available from Instron, with the condition of pulling a polyamideimide film having a length of 50 mm and a width of 10 mm at 50 mm/min at 25° C.

The thickness of the film was measured and the value was input to the instrument. The unit of the modulus was GPa and the unit of the elongation at break was %.

5) Light Transmittance

In accordance with the standard of ASTM D1746, a total light transmittance was measured in the entire wavelength range of 400 to 700 nm using a spectrophotometer (from Nippon Denshoku, COH-400) and a single wavelength light transmittance was measured at 388 nm using UV/Vis (Shimadzu, UV3600), on a film having a thickness of 50 μm. The unit was %.

6) Haze

In accordance with the standard of ASTM D1003, the haze was measured based on a film having a thickness of 50 μm, using a spectrophotometer (from Nippon Denshoku, COH-400). The unit was %.

7) Yellow Index (YI) and b* Value

In accordance with the standard of ASTM E313, the yellow index and the b* value were measured based on a film having a thickness of 50 μm, using a colorimeter (from HunterLab, ColorQuest XE).

8) Water Contact Angle

The contact angle was measured using a water contact angle measurer (Kruss, DSA) in accordance with ASTM D5946.

9) Pencil Hardness

In accordance with JIS K 5400, a line of 20 mm was drawn at a speed of 50 mm/sec on a film using a load of 750 g and this operation was repeated 5 times or more, and the pencil hardness was measured based on the case in which two or more scratches occurred.

10) Measurement of Curl Amount

A hard coating film of 10 cm×10 cm was tilted 45° to the MD direction under constant temperature and humidity conditions of 25±3° C. and 60±5% RH and allowed to stand for 12 hours, and then a vertical height (unit: mm) of a surface connecting from the lowest point (for example, center) to the vertex of the film for plane connecting each vertex was measured and a maximum value was set as the curl amount (mm).

11) Evaluation of Folding Properties (Dynamic Bending Properties)

A hard coating film was cut into 100 mm in width and 200 mm in length. The film was fixed to a folding tester (YUASA) using an adhesive, based on IEC 62715-6-1. A folding radius was set at 3 mmR, a repetitive in-folding (inside a coating surface) test was performed repeatedly 100,000 times and 200,000 times, and cracks in a folded portion were visually confirmed. Whether fine cracks occurred was observed using a microscope.

[Preparation Example 1] Preparation of Substrate Layer

Terephthaloyl dichloride (TPC) and 2,2'-bis(trifluoromethyl)-benzidine (TFMB) were added to a mixed solution of dichloromethane and pyridine in a reactor, and stirring was performed at 25° C. for 3 hours under a nitrogen atmosphere. Here, a mole ratio of TPC:TFMB was 300:400, and a solid content was adjusted to 12 wt %. Thereafter, the reactant was precipitated in an excessive amount of methanol and filtered to obtain a solid content, which was dried under vacuum at 50° C. for 6 hours or more to obtain an oligomer, and the prepared oligomer had a formula weight (FW) of 1690 g/mol.

N,N-dimethylacetamide (DMAc), 100 mol of the oligomer, and 28.6 mol of 2,2'-bis(trifluoromethyl)-benzidine (TFMB) were added to the reactor and sufficient stirring was performed.

After confirming that the solid raw material was completely dissolved, fumed silica (surface area of 95 m²/g, <1 μm) was added to DMAc at a content of 1000 ppm relative to the solid content, and added to the reactor after being dispersed using ultrasonic waves. 64.3 mol of cyclobutanetetracarboxylic dianhydride (CBDA) and 64.3 mol of 4,4'-hexafluoroisopropylidene diphthalic anhydride (6FDA) were subsequently added, sufficient stirring was performed, and the mixture was polymerized at 40° C. for 10 hours. Here, the solid content was 20%. Subsequently, each of pyridine and acetic anhydride was added at 2.5-fold relative to the total content of dianhydride, and stirring was performed at 60° C. for 12 hours.

After the polymerization was finished, the polymerization solution was precipitated in an excessive amount of methanol and filtered to obtain a solid content, which was dried under vacuum at 50° C. for 6 hours or more to obtain polyamideimide powder. The powder was diluted and dissolved at 20% in DMAc to prepare a composition for forming a substrate layer.

The composition for forming a substrate layer was coated on a polyethylene terephthalate (PET) substrate film using an applicator, dried at 80° C. for 30 minutes and 100° C. for 1 hour, and cooled to room temperature to prepare a film. Thereafter, stepwise heat treatment was performed at a heating rate of 20° C./min at 100 to 200° C. and 250 to 300° C. for 2 hours.

The thus-prepared polyamideimide film had a thickness of 50 μm, a transmittance at 388 nm of 15%, a total light transmittance of 89.73%, a haze of 0.4%, a yellow index (YI) of 1.9, a b* value of 1.0, a modulus 1.0 GPa, an elongation at break of 21.2%, a weight average molecular weight of 310,000 g/mol, a polydispersity index (PDI) of 2.11, and a pencil hardness of HB/750 g.

[Preparation Example 2] Preparation of Composition for Forming a Hard Coating Layer 3-Acryloxypropyltrimethoxysilane (APTMS, TCI) and water were mixed at a ratio of 24.64 g:2.70 g (0.1 mol: 0.15 mol) and placed in a 250 mL 2-neck flask. Thereafter, 0.1 mL of a tetramethylammonium hydroxide catalyst and 100 mL of tetrahydrofuran were added to the mixture and stirred at 25° C. for 36 hours.

Thereafter, layer separation was performed, a product layer was extracted with methylene chloride, water was removed from an extract with magnesium sulfate, and the solvent was dried under vacuum to obtain a resin. As a result of measuring the weight average molecular weight of the epoxy siloxane resin using gel permeation chromatography (GPC), the weight average molecular weight was 8100 g/mol.

A composition in which 30 g of the acrylsiloxane resin, 13 g of pentaerythritol tetraacrylate, 2 g of 1-hydroxycyclohexylphenylketone as a photoinitiator, 5 g of a fluroine-based additive (Megaface RS90 from DIC, acrylate modified fluorine), and 50 g of methyl ethyl ketone were mixed was prepared.

[Preparation Example 3] Preparation of Composition for Forming Hard Coating Layer A composition was prepared in the same manner as in Preparation Example 2, except that the contents of pentaerythritol tetraacrylate and the fluorine-based additive (Megaface RS90 from DIC, acrylate modified fluorine) were changed to 15 g and 3 g, respectively.

[Preparation Example 4] Preparation of Composition for Forming Hard Coating Layer A composition was prepared in the same manner as in Preparation Example 2, except that the acryl siloxane resin was not used, and 43 g of pentaerythritol, 2 g of 1-hydroxycyclohexylphenylketone as the photoinitiator, and 53 g of methyl ethyl ketone were mixed.

Example 1

The composition for forming a hard coating layer prepared in Preparation Example 2 was applied on one surface of the polyamideimide film prepared in Preparation Example 1 using a Meyer bar, cured at 60° C. for 5 minutes, irradiated with UV at 1 J/cm$^2$ using a high-pressure metal lamp, and thermally cured at 120° C. for 15 minutes to form a hard coating layer, thereby preparing a window cover film. The physical properties of the thus-prepared window cover film were measured, and are shown in the following Table 1.

Example 2

A window cover film was prepared in the same manner as in Example 1, except that a hard coating layer having a thickness of 3 μm was formed. The physical properties of the thus-prepared window cover film were measured, and are shown in the following Table 1.

Example 3

A window cover film was prepared in the same manner as in Example 1, except that the composition for forming a hard coating layer prepared in Preparation Example 3 was used instead of that prepared in Preparation Example 2. The physical properties of the thus-prepared window cover film were measured, and are shown in the following Table 1.

Comparative Example 1

A window cover film was prepared in the same manner as in Example 1, except that the composition for forming a hard coating layer prepared in Preparation Example 4 was used instead of that prepared in Preparation Example 2. The physical properties of the thus-prepared window cover film were measured, and are shown in the following Table 1.

Comparative Example 2

The physical properties of the polyamideimide film having a thickness of 50 μm prepared in Preparation Example 1 without forming the hard coating layer in Example 1 were measured, and are shown in the following Table 1.

Comparative Example 3

A window cover film was prepared in the same manner as in Example 1, except that a polyethylene terephthalate (PET) film having a thickness of 50 μm was used instead of the polyamideimide film prepared in Preparation Example 1. The physical properties of the thus-prepared window cover film were measured, and are shown in the following Table 1.

TABLE 1

|  | Example 1 | Example 2 | Example 3 | Comparative Example 1 | Comparative Example 2 | Comparative Example 3 |
|---|---|---|---|---|---|---|
| Static friction coefficient (a) | 0.10 | 0.11 | 0.12 | 0.25 | 0.56 | 0.15 |
| Kinetic friction coefficient (b) | 0.11 | 0.11 | 0.1 | 0.15 | 0.29 | 0.09 |
| a/b | 1.1 | 1.0 | 1.2 | 1.67 | 1.93 | 1.67 |
| Touch | 10 | 9 | 10 | 5 | 3 | 8 |
| Pencil hardness | 4H | 4H | 4H | 3H | HB | 2H |
| Total light transmittance (%) | 90.45 | 90.69 | 90.55 | 89.91 | 89.15 | 88.71 |
| Haze (%) | 0.35 | 0.41 | 0.45 | 0.61 | 0.36 | 1.1 |
| Yellow index | 1.7 | 1.72 | 1.75 | 1.89 | 1.96 | 1.3 |
| Water contact angle (°) | 110 | 109 | 111 | 101 | 93 | 103 |
| Curl amount (mm) | 3 | 5 | 2 | 20 | 5 | 15 |
| Fine cracks 30,000 times | None | None | None | None | — | 5 EA |
| 100,000 times | None | None | None | 10 EA | — | 15 EA |
| 200,000 times | None | None | None | Multiple | — | Multiple |

The window cover film of the present invention feels like glass to the touch, has excellent slip properties, has a high surface hardness, is flexible, and has excellent bending properties.

In addition, even in the case of repetitive deformation, the hard coating layer and the window cover film are not substantially and semi-permanently deformed and damaged and have excellent restoring force.

Therefore, a window cover film which may be applied to a display having a curved shape, a foldable device, or the like, may be provided.

In addition, durability and long-term life characteristics of the flexible display may be secured.

In addition, physical and chemical stability may be secured even under high temperature and high humidity conditions.

In addition, the window cover film according to an exemplary embodiment of the present invention may provide a window cover film having excellent fouling resistance and improved wear resistance, unlike the related art.

The window cover film of the present invention may have further improved flexibility and mechanical strength due to a bond between the polyamideimide substrate layer and the hard coating layer.

Hereinabove, although the present invention has been described by specific matters, limited exemplary embodiments, and drawings, they have been provided only for assisting the entire understanding of the present invention, and the present invention is not limited to the exemplary embodiments, and various modifications and changes may be made by those skilled in the art to which the present invention pertains from the description.

Therefore, the spirit of the present invention should not be limited to the above-described exemplary embodiments, and the following claims as well as all modified equally or equivalently to the claims are intended to fall within the scope and spirit of the invention.

What is claimed is:

1. A window cover film comprising a substrate layer made up of a polyamideimide-based resin and a hard coating layer formed directly on at least one surface of the substrate layer, wherein a kinetic friction coefficient is less than 0.15, the kinetic friction coefficient being measured at a speed of 100 mm/min with a force of 5 N under a load of 200 g using parchment paper as an object to be frictionized on the hard coating layer, and a ratio of a static friction coefficient a to the kinetic friction coefficient b satisfies the following Equation 1:

$$1 \leq a/b \leq 1.2, \quad \text{[Equation 1]}$$

wherein the substrate layer is made up of a polyamide-imide (PAI)-based resin including a fluorine atom and an aliphatic cyclic structure and the hard coating layer is formed of a composition for forming a hard coating layer including a (meth) acryl-based siloxane resin and a polyfunctional (meth) acrylate-based compound, and wherein the polyamideimide (PAI)-based resin is prepared by preparing an amine-terminated polyamide oligomer from a first fluorine-based aromatic diamine and an aromatic diacid dichloride, and polymerizing the amine-terminated polyamide oligomer with a monomer derived from a second fluorine-based aromatic diamine, an aromatic dianhydride, and a cycloaliphatic dianhydride.

2. The window cover film of claim 1, wherein the static friction coefficient is 0.2 or less.

3. The window cover film of claim 1, wherein the kinetic friction coefficient is 0.1 or less.

4. The window cover film of claim 1, wherein the substrate layer has a modulus in accordance with ASTM D882 of 3 GPa or more, an elongation at break of 8% or more, a light transmittance of 5% or more as measured at 388 nm in accordance with ASTM D1746, a total light transmittance of 87% or more as measured at 400 to 700 nm, a haze of 2.0% or less, a yellow index of 5.0 or less, and a b* value of 2.0 or less.

5. The window cover film of claim 1, wherein the substrate layer has a thickness of 10 to 500 μm and the hard coating layer has a thickness of 1 to 50 μm.

6. The window cover film of claim 1, wherein the hard coating layer has a pencil hardness of 4H or more and a water contact angle of 80° or more.

7. The window cover film of claim 1, wherein the window cover film has a curl amount of 5 mm or less, the curl amount being measured at each vertex of a square sample having a side length of 10 cm each which has been cut to be inclined at an angle of 45° to an MD direction of the film.

8. The window cover film of claim 1, wherein the window cover film has no crack occurrence at 30,000 to 200,000 times in evaluation of dynamic bending properties.

9. A flexible display panel comprising the window cover film of claim 1.

* * * * *